United States Patent
Lee et al.

(10) Patent No.: US 8,385,136 B2
(45) Date of Patent: Feb. 26, 2013

(54) MEMORY CIRCUIT AND METHOD OF OPERATING THE SAME

(75) Inventors: Cheng Hung Lee, Hsinchu (TW); Jung-Ping Yang, Jui-bei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 179 days.

(21) Appl. No.: 12/913,087

(22) Filed: Oct. 27, 2010

(65) Prior Publication Data

US 2012/0106269 A1    May 3, 2012

(51) Int. Cl.
*G11C 5/14* (2006.01)

(52) U.S. Cl. ......... 365/189.09; 365/230.06; 365/230.03

(58) Field of Classification Search ............. 365/189.09, 365/230.06, 230.03, 222, 194, 203, 205, 365/149, 233, 191
See application file for complete search history.

(56) References Cited

U.S. PATENT DOCUMENTS

| | | | |
|---|---|---|---|
| 6,542,426 B2 * | 4/2003 | Jung et al. ............... 365/222 |
| 6,867,628 B2 * | 3/2005 | Cho et al. ............... 327/262 |
| 7,106,620 B2 | 9/2006 | Chang et al. |
| 7,123,504 B2 | 10/2006 | Yabe |
| 7,136,296 B2 | 11/2006 | Luk et al. |
| 7,301,793 B2 | 11/2007 | Kanehara et al. |
| 7,400,523 B2 | 7/2008 | Houston |
| 7,400,524 B2 | 7/2008 | Otsuka |
| 7,606,060 B2 | 10/2009 | Chan et al. |
| 7,742,326 B2 | 6/2010 | Houston |
| 7,764,557 B2 * | 7/2010 | Kim ............... 365/207 |
| 7,826,251 B2 | 11/2010 | Chang et al. |
| 7,983,071 B2 | 7/2011 | Houston |
| 8,050,113 B2 * | 11/2011 | Byeon ............... 365/189.09 |
| 8,072,798 B2 | 12/2011 | Takeyama |
| 2005/0047235 A1 * | 3/2005 | Noh ............... 365/205 |
| 2009/0154278 A1 * | 6/2009 | Chan-Choi et al. ........... 365/222 |

FOREIGN PATENT DOCUMENTS

CN    1808621    7/2006

OTHER PUBLICATIONS

Office Action dated Sep. 4, 2012 from corresponding application No. CN 201010227887.X.

* cited by examiner

*Primary Examiner* — Dang Nguyen
(74) *Attorney, Agent, or Firm* — Lowe Hauptman Ham & Berner, LLP

(57) ABSTRACT

The present application discloses a memory circuit having a first data line configured to carry a first data line signal and a second data line configured to carry a second data line signal. Further, a first driver is coupled to the first data line and the second data line and configured to establish a first current path for the first data line responsive to the second data line signal. Similarly, a second driver is coupled to the first data line and the second data line and configured to establish a second current path for the second data line responsive to the first data line signal. The memory circuit further has a first driver enabling line configured to selectively enable the first driver and a second driver enabling line configured to selectively enable the second driver.

20 Claims, 7 Drawing Sheets

MEMORY CIRCUIT AND METHOD OF OPERATING THE SAME

RELATED APPLICATIONS

The present application relates to U.S. patent application Ser. No. 12/704,710, filed on Feb. 12, 2010, which is incorporated herein by reference in its entirety.

BACKGROUND

Semiconductor memory circuits include, for example, static random access memory (SRAM), dynamic random access memory (DRAM), read only memory (ROM), and other non-volatile memory circuits. While the size of a memory circuit becomes smaller and its capacity becomes larger, variations in manufacturing process have greater impacts to the performance of the memory circuit.

For example, a "weak bit" is a memory cell in a memory circuit where the memory cell has a relatively low current driving capability or a relatively high leakage current compared with a normal bit due to process/device variations. The weak bit results in a slow response time and affects the performance of a memory circuit. For example, the cell current of a weak bit may be 30% lower than a normal bit due to process/device variation, and the operating frequency may also be degraded by more than 30%.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the invention.

Figure 1:
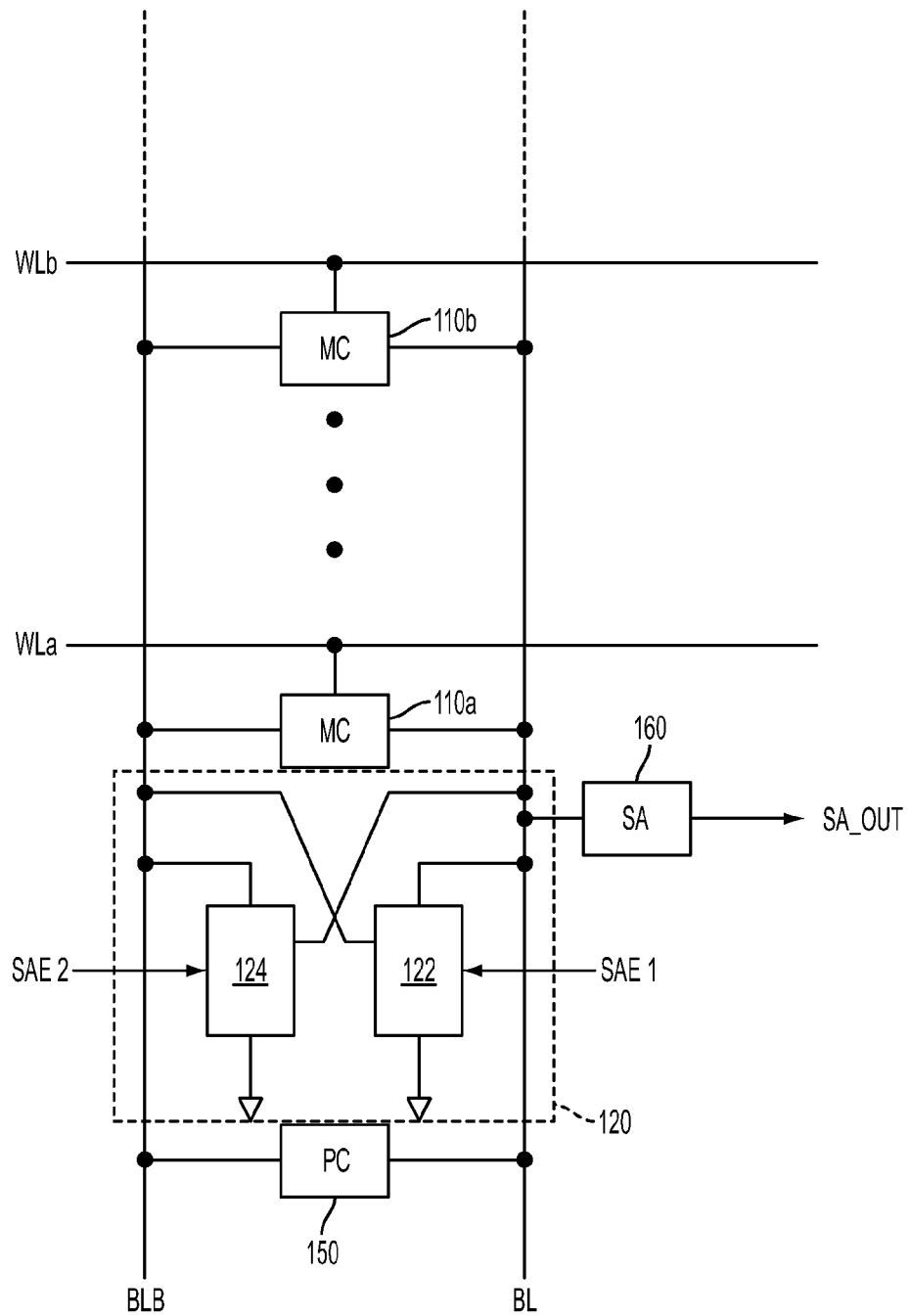
FIG. 1 is a circuit diagram of a memory circuit according to an embodiment.

FIG. 1 is a circuit diagram of a memory circuit 100 according to an embodiment. Memory circuit 100 includes memory cells 110a and 110b that are capable of storing data. In at least one embodiment, the memory cells 110a and 110b are SRAM memory cells. Each of the memory cells 110a and 110b is coupled to a corresponding memory cell selection line, such as a word line WLa and WLb, respectively. Further, each memory cell 110a and 110b is coupled to a pair of data lines each carrying a data line signal, such as a bit line BL carrying a bit line signal and a bit line bar BLB carrying a bit line bar signal. The bit line BL and the bit line bar BLB are usable for carrying signals representing opposite logic states. In some embodiments, memory cell 110a is coupled to only one data line. When at least one memory cell selection line, WLa or WLb, is enabled to select at least a corresponding memory cell 110a or 110b, the datum/data stored in the selected memory cell 110a or 110b charges or discharges one of the data lines BL or BLB in order to output the stored information to the data lines BL or BLB.

The memory circuit 100 further comprises a weak-bit compensating circuit 120 capable of compensating weak bit effects for the memory circuit 100. The weak-bit compensating circuit 120 has a first driver 122 and a second driver 124. The first driver 122 is coupled to the first data line BL and the second data line BLB. The first driver 122 is capable of establishing a first current path for the first data line BL responsive to the second data line signal on the second data line BLB. A first driver enabling line SAE1 is coupled to the first driver 122 and is usable to selectively enable the first driver 122. Similarly, the second driver 124 is coupled to the first data line BL and the second data line BLB. The second driver 124 is capable of establishing a second current path for the second data line BLB responsive to the first data line signal on the first data line BL. A second driver enabling line SAE2 is coupled to the second driver 124 and is usable to selectively enable the second driver 124.

The memory circuit 100 further comprises a precharge circuit 150 coupled to the first and the second data lines BL and BLB and a single-ended sense amplifier 160 coupled to the first data line BL. When reading a datum stored in memory cell 110a or 110b, the precharge circuit charges the first data line BL and the second data line BLB to a first logic state, such as a logic 1 or a HIGH voltage level (i.e., a positive power supply voltage), before coupling the stored datum to the first data line BL and/or the second data line BLB. After precharging the first data line BL and the second data line BLB, the precharge circuit 150 is disabled, and the first data line BL and/or the second data line BLB is discharged according to the stored datum of the selected memory cell.

After the first and the second data lines BL and BLB are precharged and subsequently discharged according to the datum stored in the selected memory cell 110a or 110b, the sense amplifier 160 detects the signal on the first data line BL and amplifies the signal in order to generate a full-swing digital output SA_OUT (i.e., having an output either at the HIGH voltage level or a LOW voltage level, the LOW voltage level refers to a negative power supply voltage or ground). Although the embodiment depicted in FIG. 1 discloses a single-ended sense amplifier 160, in some embodiments, the sense amplifier 160 is a differential sense amplifier that couples to both the first data line BL and the second data line BLB.

In the present embodiment, the first data line BL and the second data line BLB are precharged to the HIGH voltage level at the begining of a read operation. When reading a logic 0, the first data line BL is pulled toward the LOW voltage level by the selected memory cell 110a or 110b, and the first driver 122 responds to the HIGH voltage level at the second data line BLB to speed up the transition of the signal on the first data line BL from logic 1 to logic 0 or from the HIGH voltage level to the LOW voltage level. Similarly, when reading a logic 1, the second data line BLB is pulled toward the LOW voltage level by the selected memory cell 110a or 110b, and the second driver 124 responds to the HIGH voltage level at the first data line BL to speed up the transition of the signal on the second data line BLB from logic 1 to logic 0 or from the HIGH voltage level to the LOW voltage level.

Thus, by speeding up the transition of signals on the first data line BL and the second data line BLB, the chance that the sense amplifier 160 outputs an incorrect result (i.e., a read disturbance) is minimized. A read disturbance refers to an incorrect output of the sense amplifier 160 while reading a datum stored in a memory cell.

Although the embodiment depicted in FIG. 1 shows only two memory cells 110a and 110b, in some embodiments, there are more or less than two memory cells. In at least one embodiment, there are 10-1,000 memory cells 110a and 110b sharing the same first data line BL and the second data line BLB. In some embodiments, there are two or more weak-bit compensating circuits 120 for a pair of data lines BL and BLB. In some embodiments, there are 10-1,000 memory cells 110a and 110b sharing the same weak-bit compensating circuit 120.

Figure 2:
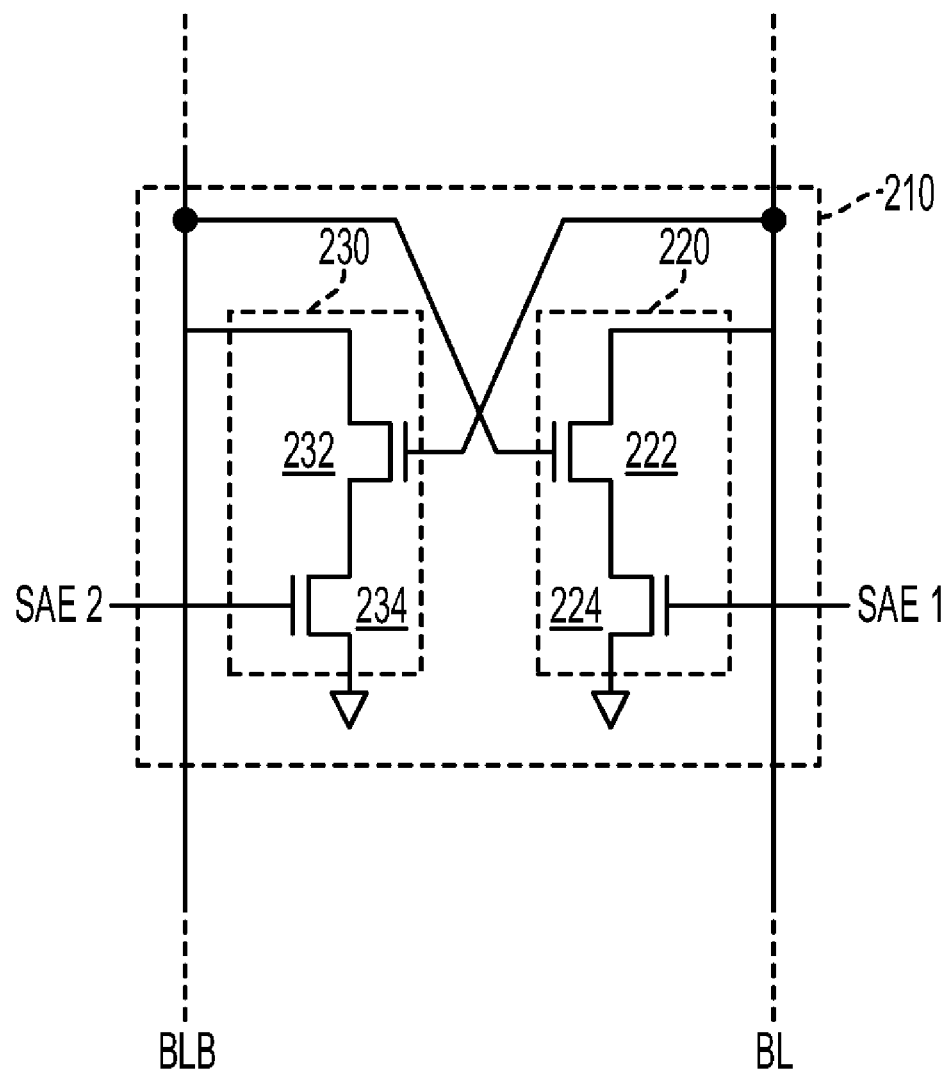
FIG. 2 is a circuit diagram of a weak-bit compensating circuit according to an embodiment.

Referring to FIG. 2 which depicts a circuit diagram of a weak-bit compensating circuit 210 according to an embodiment. The weak-bit compensating circuit 210 has a first driver 220 and a second driver 230 that are usable for the memory circuit 100 depicted in FIG. 1. The first driver 220 has a set of cascaded transistors including a first transistor 222 and a second transistor 224. The first transistor 222 has a drain coupled to the first data line BL and a gate coupled to the second data line BLB. The second transistor 224 has a drain coupled to a source of the first transistor 222 and a source coupled to a power line, such as a ground. In some embodiments, the source of the second transistor 224 is coupled to a positive power supply VDD or a negative power supply VSS. The gate of the second transistor 224 is coupled to the first enabling line SAE1.

Similar to the configuration of the first driver 220, the second driver 230 has another set of cascaded transistors including a third transistor 232 and a fourth transistor 234. The third transistor 232 has a drain coupled to the second data line BLB and a gate coupled to the first data line BL. The fourth transistor 234 has a drain coupled to a source of the third transistor 232 and a source coupled to a power line, such as ground. In some embodiments, the source of the fourth transistor 234 is coupled to a positive power supply VDD or a negative power supply VSS. The gate of the fourth transistor 234 is coupled to the second enabling line SAE2.

Therefore, the first transistor 222 and the third transistor 232 form a latch-style configuration with the first and the second data lines BL and BLB, and the second transistor 224 and the fourth transistor 234 are usable to selectively enable the current path established by the first transistor 222 and the third transistor 232 to the ground, respectively. In the present embodiment, the first transistor 222 and the third transistor 232 are N-channel metal-oxide semiconductor (NMOS) transistors. However, in some embodiments, the first transistor 222 and the third transistor 232 are bipolar junction transistors, P-channel metal-oxide semiconductor (PMOS) transistors, or any applicable semiconductor devices that are capable of forming a latch-style configuration with the first and the second data lines BL and BLB. Further, in the present embodiment, the second transistor 224 and the fourth transistor 234 are NMOS transistors as well. In some embodiments, the second transistor 224 and the fourth transistor 234 are bipolar junction transistors, PMOS transistors, pass gates, or any applicable semiconductor devices that are usable as switches.

When reading a logic 0 stored in the selected memory cell (e.g. 110a or 110b in FIG. 1), the first data line BL is pulled toward the LOW voltage level by the memory cell. After the first driver 220 is enabled, the first transistor 222 responds to the HIGH voltage level at the second data line BLB and is turned on to establish a current path for the first data line BL in order to speed up the transition of the signal on the first data line BL from logic 1 to logic 0 or from the HIGH voltage level to the LOW voltage level. Meanwhile, after the second driver 230 is enabled, the third transistor 232 is turned off responsive to the LOW voltage level on the first data line BL. However, under some circumstances during the transition of logic states, the voltage level on first data line BL is not low enough to fully turn off the third transistor 232. Consequently, the signal on the second data line BLB is pulled down during the transition, and thus the possibility of a read disturbance increases. Therefore, in some embodiments, the second driver 230 is enabled no earlier than the first driver 220.

When reading a logic 1 stored in the selected memory cell (e.g. 110a or 110b in FIG. 1), the second data line BLB is pulled toward the LOW voltage level by the memory cell. After the first driver 220 is enabled, the first transistor 222 is turned off responsive to the LOW voltage level at the second data line BLB. Also, after the second driver 230 is enabled, the third transistor 232 is turned on to establish a current path for the second data line BLB in order to speed up the transition of the signal on the second data line BLB from logic 1 to logic 0 or from the HIGH voltage level to the LOW voltage level. However, under some circumstances during the transition of logic states, the voltage level on second data line BLB is not low enough to fully turn off the first transistor 222. As a result, the signal on the first data line BL is pulled down during the transition, and thus the possibility of a read disturbance increases as well. Therefore, in some embodiment, the first driver 220 is enabled no earlier than the selection of the memory cell 110a or 110b.

Figure 3:
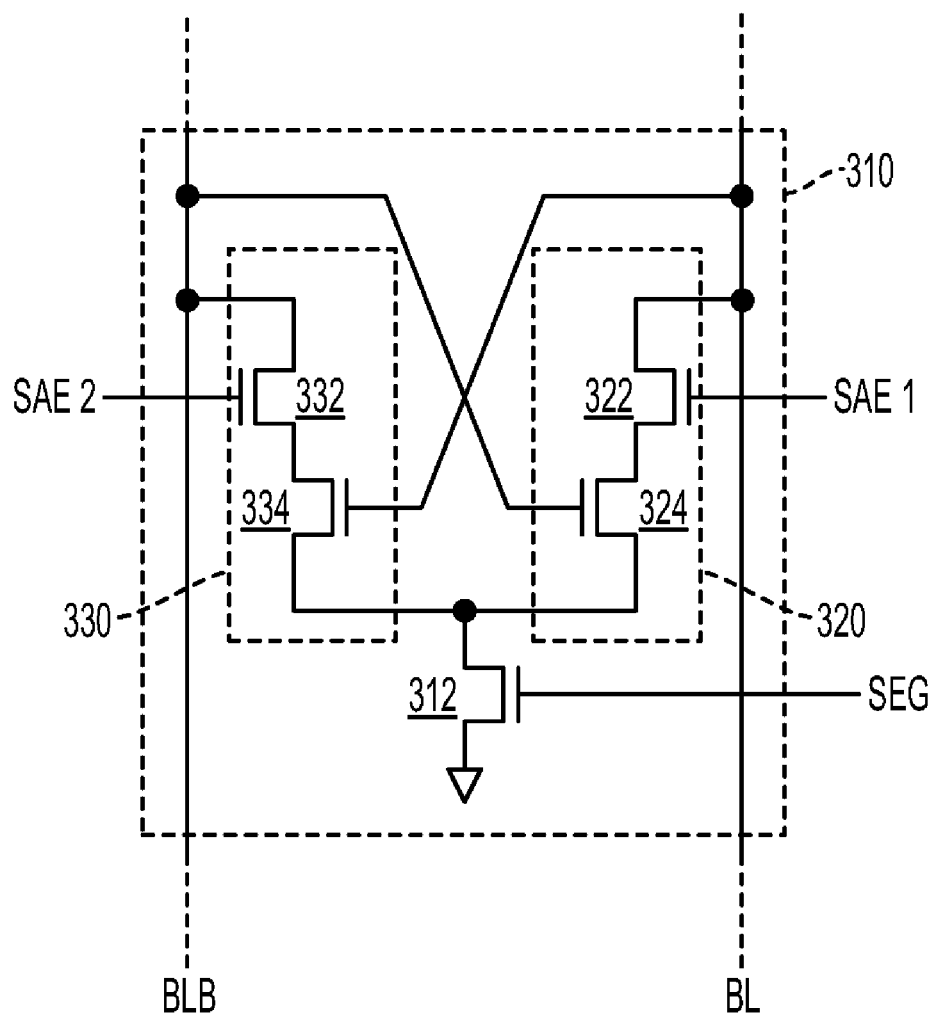
FIG. 3 is a circuit diagram of a weak-bit compensating circuit according to another embodiment.

FIG. 3 is a circuit diagram of a weak-bit compensating circuit according to another embodiment. The weak-bit compensating circuit 310 has a first driver 320 and a second driver 330 that are usable for the memory circuit 100 as depicted in FIG. 1. The first driver 320 has a set of cascaded transistors including a first transistor 322 and a second transistor 324. The first transistor 322 has a drain coupled to the first data line BL. The second transistor 324 has a drain coupled to a source of the first transistor 322 and a gate coupled to the second data line BLB. The source of the second transistor 324 is coupled to a switch 312. The switch 312 is a transistor that is coupled between a power line and the first and the second driver 320 and 330 and controlled by a compensating circuit enabling line SEG usable to selectively enable the first driver 320 and the second driver 330. In some embodiments, the source of the second transistor 324 is coupled to the power line, and the switch 312 is omitted. In some embodiments, the source of the second transistor 324 is coupled to a ground, a positive power supply VDD, or a negative power supply VSS. The gate of the first transistor 322 is coupled to the first enabling line SAE1.

Similar to the configuration of the first driver 320, the second driver 330 has a set of cascaded transistors including a third transistor 332 and a fourth transistor 334. The third transistor 332 has a drain coupled to the second data line BLB. The fourth transistor 334 has a drain coupled to a source of the third transistor 332 and a gate coupled to the first data line BL. The source of the fourth transistor 334 is coupled to the switch 312. In some embodiments, the source of the fourth transistor 334 is coupled to the power line, and the switch 312 is omitted. In some embodiments, the source of the fourth transistor 334 is coupled to a ground, a positive power supply VDD, or a negative power supply VSS. The gate of the third transistor 332 is coupled to the second enabling line SAE2.

Similar to the embodiment depicted in FIG. 2, the second transistor 324 and the fourth transistor 334 form a latch-style configuration with the first and the second data lines BL and BLB, and the first transistor 322 and the third transistor 332 are capable of selectively enabling the current paths established by the second transistor 324 and the fourth transistor 334, respectively. In the present embodiment, the second transistor 324 and the fourth transistor 334 are NMOS transistors. However, in some embodiments, the second transistor 324 and the fourth transistor 334 are bipolar junction transistors, PMOS transistors, or any applicable semiconductor devices that are capable of forming a latch-style configuration with the pair of data lines BL and BLB. Further, in the present embodiment, the first transistor 322 and the third transistor 332 are NMOS transistors. In some embodiments, the first transistor 322 and the third transistor 332 are bipolar junction transistors, PMOS transistors, pass gates, or any applicable semiconductor devices that are usable as switches.

Figure 4A:
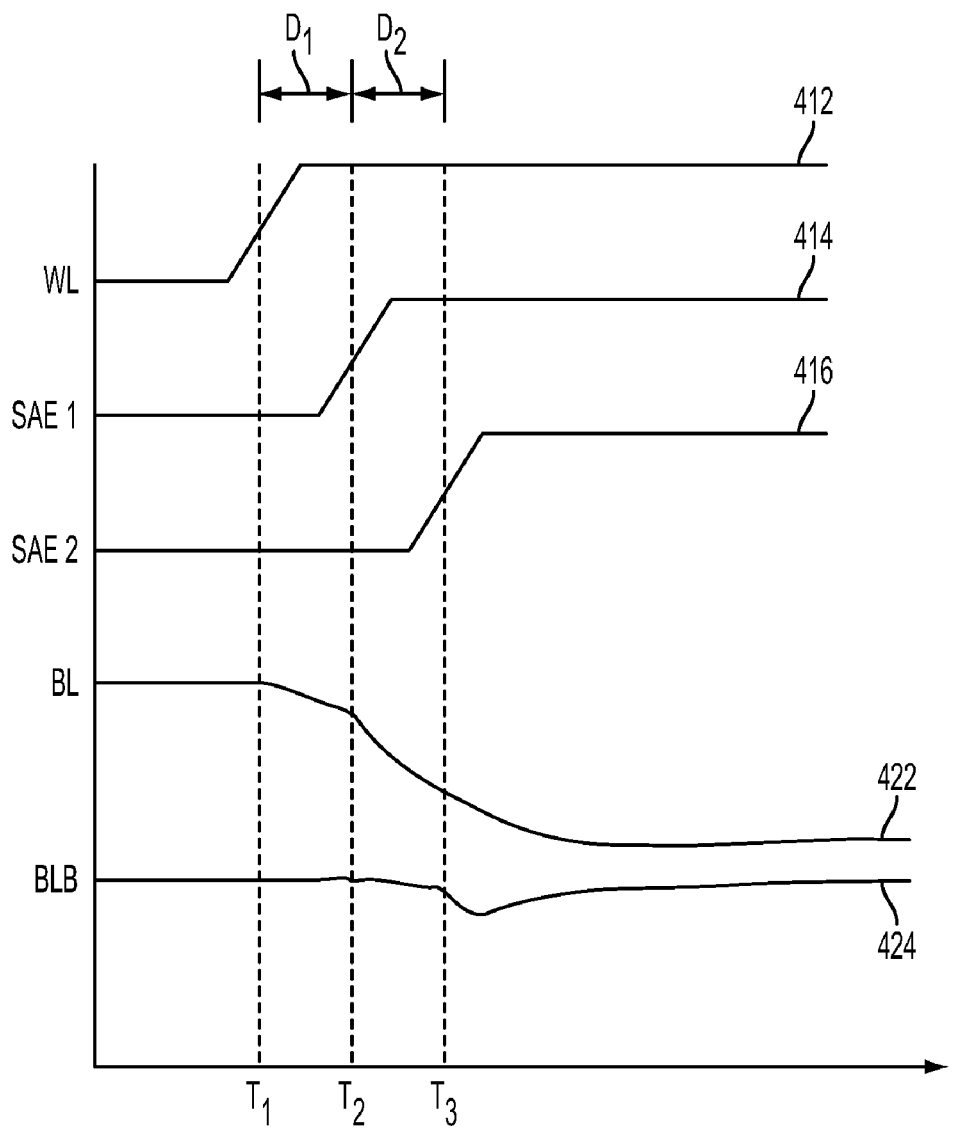
FIG. 4A is a timing chart of a memory circuit when reading a logic 0 according to an embodiment.

FIG. 4A is a timing chart of a memory circuit as depicted in FIG. 1 when reading a logic 0 from a selected memory cell according to an embodiment. The waveform 412 depicts a cell selection signal on the cell selection line WLa or WLb with a transition from a LOW voltage level to a HIGH voltage level to select a memory cell 110a or 110b. Waveforms 414 and 416 are the enabling signals carried by the first driver enabling line SAE1 and the second driver enabling line SAE2, respectively. Waveforms 422 and 424 depict the transition of signals on the first data line BL and the second data line BLB, respectively, when reading a logic 0 from the selected memory cell 110a or 110b.

When reading a logic 0 datum stored in the selected memory cell 110a or 110b, the first and the second data lines are precharged to the HIGH voltage level. At time $T_1$, the cell selection line WLa or WLb is enabled to select the target memory cell 110a or 110b. After the memory cell is selected, the memory cell starts to discharge the first data line BL according to the stored datum (logic 0). At time $T_2$, after the memory cell has been selected for a first predetermined delay $D_1$, the first driver enabling signal on the first driver enabling line SAE1 is switched to the HIGH voltage level in order to enable the first driver 122. As a result, the first driver 122 speeds up the signal transition on the first data line BL.

Subsequently, at time $T_3$, after the first driver 122 has been enabled for a second predetermined delay $D_2$, the second driver enabling signal on the second driver enabling line SAE2 is switched to the HIGH voltage level in order to enable the second driver 124. In the present embodiment, because the signal on the first data line BL is not pulled to the LOW voltage completely when the second driver 124 is enabled, the second driver 124 is partially on to pull the voltage level on the second data line BLB down. The latch-style configuration of the first driver 122 and the second driver 124 further separates the signals on the first data line BL and the second data line BLB toward the HIGH or LOW voltage level.

Figure 4B:
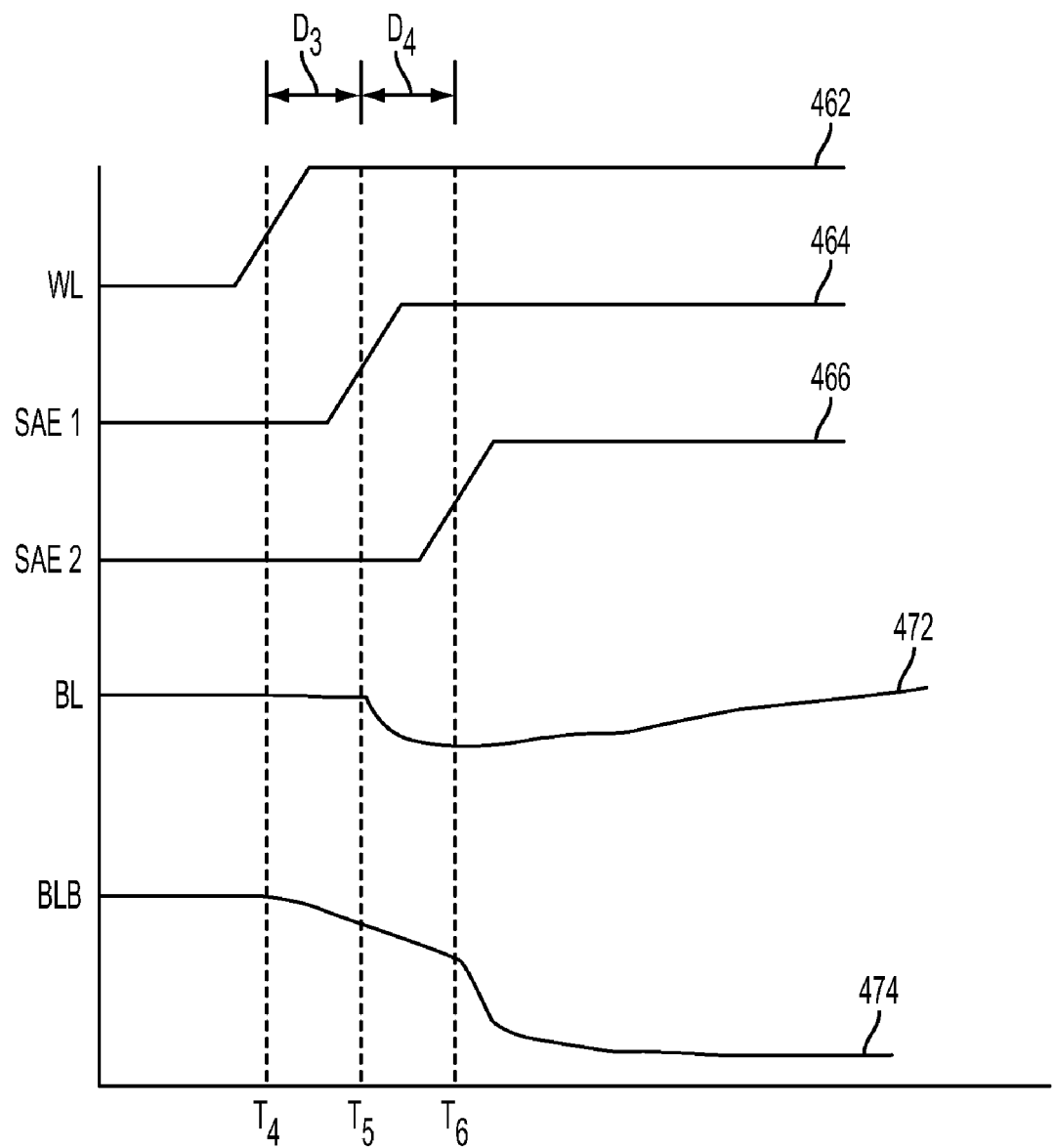
FIG. 4B is a timing chart of a memory circuit when reading a logic 1 according to an embodiment.

FIG. 4B is a timing chart of a memory circuit as depicted in FIG. 1 when reading a logic 1 from a selected memory cell according to an embodiment. Similarly, the waveform 462 depicts a cell selection signal on the cell selection line WLa or WLb with a transition from a LOW voltage level to a HIGH voltage level to select a memory cell 110a or 110b. Waveforms 464 and 466 are the enabling signals carried by the first driver enabling line SAE1 and the second driver enabling line SAE2, respectively. Waveforms 472 and 474 depict the transition of signals on the first data line BL and the second data line BLB, respectively, when reading a logic 1 from the selected memory cell 110a or 110b.

When reading a logic 1 datum stored in the selected memory cell 110a or 110b, the first and the second data lines are precharged to the HIGH voltage level. At time $T_4$, the cell selection line WLa or WLb is enabled to select the target memory cell 110a or 110b. After the memory cell is selected, the selected memory cell starts to discharge the second data line BLB according to the stored datum (logic 1). At time $T_5$, after the memory cell has been selected for a third predetermined delay $D_3$, the first driver enabling signal on the first driver enabling line SAE1 is switched to the HIGH voltage level in order to enable the first driver 122. In the present embodiment, because the voltage level on the second data line BL is not pulled to the LOW voltage completely when the first driver 122 is enabled, the first driver 122 is partially on to pull the voltage level on the first data line BL down.

Subsequently, at time $T_6$, after the first driver 122 has been enabled for a fourth predetermined delay $D_4$, the second driver enabling signal on the second driver enabling line SAE2 is switched to the HIGH voltage level in order to enable the second driver 124. As a result, the second driver 124 speeds up the signal transition on the second data line BLB. The latch-style configuration of the first driver 122 and the second driver 124 further separate the signals on the first data line BL and the second data line BLB toward the HIGH or LOW voltage level.

Furthermore, the sense amplifier 160 senses and converts the signal on the first data line BL and/or the second data line BLB to a full-swing digital output SA_OUT.

Referring to FIGS. 4A and 4B, by adjusting the timing of enabling the first driver 122 and the timing of enabling the second driver 124, the operating frequency and the possibility of a read disturbance of the memory circuit 100 are also tunable. In the present embodiment, the timing of enabling the first driver 122 and the timing of enabling the second driver 124 are separately controlled by the first driver enabling line SAE1 and the second driver enabling line SAE2 in order to obtain an optimized operating frequency with minimized reading disturbance. The delays $D_1$, $D_2$, $D_3$, and $D_4$, are determined using circuit simulation when designing the memory circuit and hard-wired within the memory circuit. In some embodiments, the delays $D_1$, $D_2$, $D_3$, and $D_4$, are programmable during and/or after the manufacture of memory circuit.

In the present embodiment, the first predetermined delay $D_1$ is the same as the third predetermined delay $D_3$, and the second predetermined delay $D_2$ is the same as the fourth predetermined delay $D_4$. In at least one embodiment having a 32 kb SRAM memory circuit manufactured by 40 nm process, the first predetermined delay $D_1$ is 50 picoseconds (ps), and the second predetermined delay $D_2$ is 25 ps. In some embodiments, the delays $D_1$, $D_2$, $D_3$, and $D_4$ have different values. In yet some other embodiments, the first driver 122 is enabled before or after enabling the second driver 124. In at least one embodiment, the first driver 122 and the second driver 124 are enabled at the same time, i.e., all the delays $D_1$, $D_2$, $D_3$, and $D_4$ equal zero.

Figure 5A:
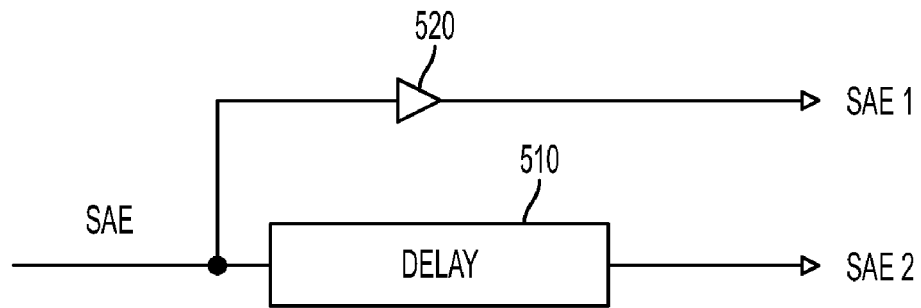
FIG. 5A is a functional block diagram of a timing control circuit that generates driver enabling signals for a weak-bit balancing circuit according to an embodiment.

FIG. 5A is a functional block diagram of a timing control circuit that generates driver enabling signals for a weak-bit balancing circuit according to an embodiment. In at least one embodiment, the enabling signals carried by the first driver enabling line SAE1 and the second driver enabling line SAE2 are derived from a common driver enabling signal carried by a driver enabling line SAE. A delay circuit 510 is coupled between the second driver enabling line SAE2 and the driver enabling line SAE. The delay circuit 510 receives the common driver enabling signal from the driver enabling line SAE, delays the received signal for a predetermined time, and then outputs the delayed signal to the second driver enabling line SAE2.

The first driver enabling line SAE1 is coupled to a buffer 520 that receives and repeats the common enabling signal from the driver enabling line SAE and outputs the buffered signal to the first driver enabling line SAE1. In some embodiments, the buffer 520 is omitted, and the first driver enabling line SAE1 is coupled to the driver enabling line SAE directly.

Figure 5B:
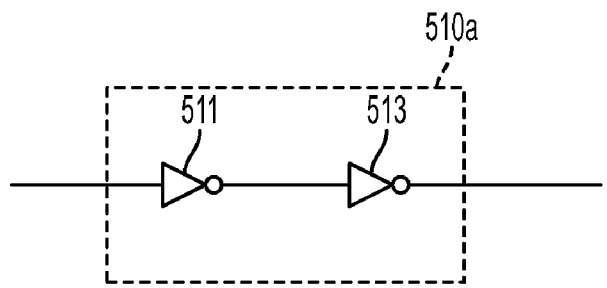
FIG. 5B is a circuit diagram of a delay circuit usable in the embodiment depicted in FIG. 5A according to an embodiment.

There are many applicable approaches to implement the delay circuit 510 in order to generate enabling signals on the first driver enabling line SAE1 and the second driver enabling line SAE1 with a predetermined delay. FIG. 5B is a circuit diagram of a delay circuit 510a usable in the embodiment depicted in FIG. 5A according to an embodiment. The delay circuit 510a comprises two inverters 511 and 513 connected in series. Thus, compared with the signal on driver enabling line SAE, the signal on second driver enabling line SAE2 has a delay equal to two gate delays. In the present embodiment, the inverters 511 and 513 are inverters chosen from a standard digital circuit library of the process that will be used to manufacture the memory circuit. In some embodiments, the actual delay is customized by modifying the lengths and/or widths of the component transistors of the inverters 511 and 513.

Figure 5C:
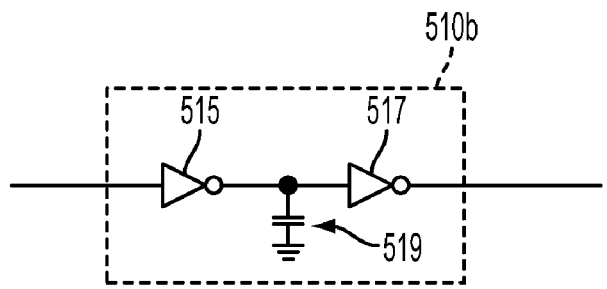
FIG. 5C is a circuit diagram of a delay circuit usable in the embodiment depicted in FIG. 5A according to another embodiment.

FIG. 5C depicts a circuit diagram of a delay circuit 510b usable in the embodiment depicted in FIG. 5A according to another embodiment. The delay circuit 510a comprises two inverters 515 and 517 connected in series. Further, a capacitor 519 has a first terminal coupled between the inverters 515 and 517 and a second terminal coupled to a power supply or ground. Compared with the embodiment depicted in FIG. 5B, the actual time delay of the delay circuit 510b is also determined by the capacitance of the capacitor 519. The capacitor 519 increases the output loading of the inverter 515, and thus further slows down the driving of the inverter 517.

Although the embodiments depicted in FIGS. 5B and 5C disclose a delay circuit 510a or 510b using two logic gates connected in series, it is not necessary to use exactly two logic gates. In some embodiments, there are more or less than two logic gates for the delay circuit 510. In some embodiments, the delay circuit also comprises one or more passive electrical components such as a resistor, inductor, or capacitor.

Figure 6:
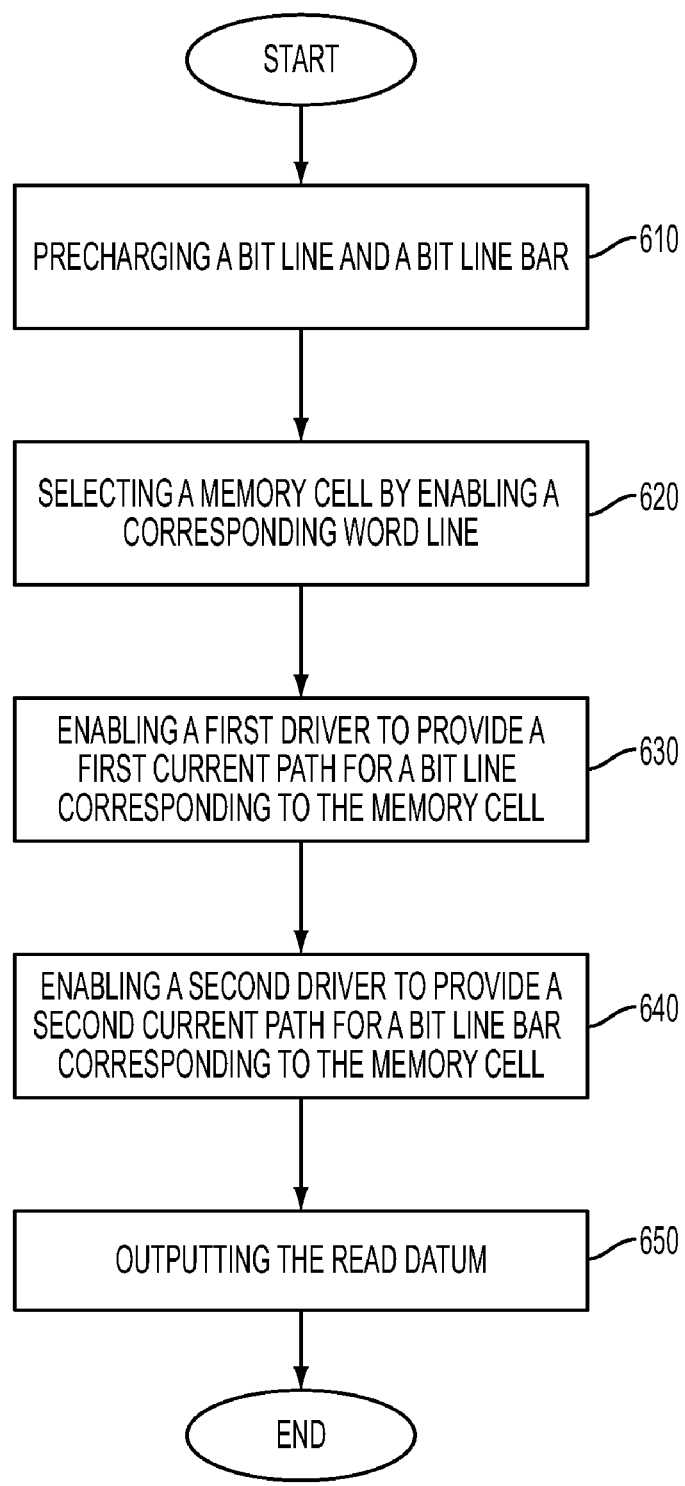
FIG. 6 is a flow chart of a method of operating a memory circuit according to an embodiment.

FIG. 6 is a flow chart of a method of operating a memory circuit according to an embodiment. A person of ordinary skill in the art will appreciate that, in some embodiments, additional operations are performed before, during, and after the method depicted in FIG. 6. Further, the disclosed operations may be added, replaced, changed order, and/or eliminated as appropriate, in accordance with the spirit and scope of the present disclosure.

Referring to FIG. 6 and FIG. 1, in operation 610, the first data line BL and the second data line BLB are precharged by the precharge circuit 150 to a predetermined voltage level, such as a HIGH voltage level that represents a logic 1 or a LOW voltage level that represents a logic 0. In the present embodiment, the first data line BL and the second data line BLB are precharged to the HIGH voltage level.

In operation 620, a target memory cell 110a or 110b of the memory circuit 100 is selected by enabling a corresponding memory cell selection line, such as a word line WLa or WLb. In the present embodiment, enabling a memory cell selection line means to drive the memory cell selection line from a first logic state (such as at a LOW voltage level) to a second state (such as a HIGH voltage level). Meanwhile, the precharge circuit 150 is disabled. At this stage, the selected memory cell 110a or 110b starts to discharge one of the data line BL or BLB according to the datum/data stored in the memory cell 110a or 110b.

Subsequently, in operation 630, after the memory cell 110a or 110b has been selected for a first predetermined delay, a first driver 122 is enabled by the signal on the first driver enabling line SAE1 to establish a first current path for the first data line BL corresponding to the memory cell. Then, in operation 640, after the first driver 122 has been enabled for a second predetermined delay, a second driver 124 is enabled by the signal on the second driver enabling line SAE2 to establish a second current path for the second data line BLB corresponding to the memory cell. In the present embodiment, enabling the first driver 122 comprises driving the first enabling line SAE1 coupled to the first driver 122 from the first logic state to the second logic state, and enabling the second driver 124 comprises driving the second enabling line SAE2 coupled to the second driver 124 responsive to a delayed signal derived from the first enabling line SAE1. In at least one embodiment, the first predetermined delay is 50 ps, and the second predetermined delay is 25 ps.

Even though embodiments of the disclosure are described in the above using NMOS transistors for the first driver 122 and the second driver 124, it is noted that an inverse function/logic can be implemented using PMOS transistors and using "pull up" configuration instead of "pull down" configuration. A skilled person in the art will appreciate that there can be many embodiment variations of this disclosure.

Although the present disclosure and its advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

What is claimed is:

1. A memory circuit, comprising:
a first data line configured to carry a first data line signal;
a second data line configured to carry a second data line signal;
a power line;
a first driver coupled to the first data line and the second data line and configured to establish only a first current path between the first data line and the power line responsive to the second data line signal;
a second driver coupled to the second data line and the first data line and configured to establish only a second current path between the second data line and the power line responsive to the first data line signal;
a first driver enabling line coupled to the first driver and configured to selectively enable the first driver; and
a second driver enabling line coupled to the second driver and configured to selectively enable the second driver, and the second driver being configured to be enabled after the first driver is enabled.

2. The memory circuit of claim 1, further comprising a switch coupled to the first driver, the second driver, and the power line, and the switch being configured to selectively enable the first driver and the second driver.

3. The memory circuit of claim 1, further comprising a delay circuit coupled to the first driver enabling line and the second driver enabling line.

4. The memory circuit of claim 3, wherein the delay circuit comprises at least one logic gate.

5. The memory circuit of claim 1, wherein the first driver comprises two cascaded transistors.

6. The memory circuit of claim 5, wherein the two cascaded transistors are NMOS transistors.

7. The memory circuit of claim 6, wherein one of the two NMOS transistors has a gate coupled to the second data line, and the other of the two NMOS transistors has a gate coupled to the first driver enabling line.

8. The memory circuit of claim 1, wherein the second driver comprises two cascaded transistors.

9. The memory circuit of claim 8, wherein the two cascaded transistors are NMOS transistors.

10. The memory circuit of claim 9, wherein one of the two NMOS transistors has a gate coupled to the first data line, and the other of the two NMOS transistors has a gate coupled to the second driver enabling line.

11. The memory circuit of claim 1, further comprising:
a memory cell coupled to at least one of the first data line or the second data line; and
a word line coupled to the memory cell;
wherein the first driver is configured to be enabled after the word line is selected.

12. A memory circuit, comprising:
a bit line configured to carry a bit line signal;
a bit line bar configured to carry a bit line bar signal;
a memory cell coupled to at least one of the bit line or the bit line bar;
a word line coupled to the memory cell;
a first set of cascaded transistors comprising:
a first transistor having a first drain, a first source, and a first gate, and the first drain being coupled to the bit line; and
a second transistor having a second drain, a second source, and a second gate, the second drain being coupled to the first source, and the second source being coupled to a power line;
a second set of cascaded transistors comprising:
a third transistor having a third drain, a third source, and a third gate, and the third drain coupled to the bit line bar; and
a fourth transistor having a fourth drain, a fourth source, and a fourth gate, the fourth drain coupled to the third source, and the fourth source coupled to the power line;
a first enabling line coupled to one of the first gate or the second gate, and the other one of the first gate or the second gate coupled to the bit line bar; and
a second enabling line coupled to one of the third gate or the fourth gate, and the other one of the third gate or the fourth gate coupled to the bit line.

13. The memory circuit of claim 12, further comprising at least a logic gate coupled between the first enabling line and the second enabling line.

14. The memory circuit of claim 12, wherein the first transistor and the second transistor are NMOS transistors.

15. The memory circuit of claim 12, wherein the third transistor and the fourth transistor are NMOS transistors.

16. The memory circuit of claim 12, the first enabling line being configured to enable the first set of cascaded transistors after the word line is selected, and the second enabling line being configured to enable the second set of cascaded transistors after the first set of cascaded transistors is enabled.

17. The memory circuit of claim 12, wherein the first enabling line is coupled to the first gate, and the bit line bar is coupled to the second gate.

18. The memory circuit of claim 12, wherein the first enabling line is coupled to the second gate, and the bit line bar is coupled to the first gate.

19. A memory circuit, comprising:
a first data line configured to carry a first data line signal;
a second data line configured to carry a second data line signal;
a first driving means for providing only a first current path for the first data line responsive to the second data line signal and a first driving means enabling signal; and
a second driver means for providing only a second current path for the second data line responsive to the first data line signal and a second driving means enabling signal,
wherein the first driving means enabling signal and the second driving means enabling signal are set to enable the second driving means after the first driving means is enabled.

20. The memory circuit of claim 19, further comprising:
a delay means for generating the second driving means enabling signal responsive to the first driving means enabling signal.

* * * * *